(12) United States Patent
Wei et al.

(10) Patent No.: US 10,212,773 B2
(45) Date of Patent: Feb. 19, 2019

(54) DIMMING DEVICE AND LIGHTING DEVICE

(71) Applicant: GE Lighting Solutions, LLC, East Cleveland, OH (US)

(72) Inventors: Hongbin Wei, Shanghai (CN); Yonghui Deng, Shanghai (CN); Qian Ni, Shanghai (CN); Longyu Chen, Shanghai (CN)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 15/729,936

(22) Filed: Oct. 11, 2017

(65) Prior Publication Data

US 2018/0103519 A1 Apr. 12, 2018

(30) Foreign Application Priority Data

Oct. 11, 2016 (CN) .......................... 2016 1 0888700

(51) Int. Cl.
*H05B 33/08* (2006.01)
*H05B 37/02* (2006.01)
*H03M 1/12* (2006.01)

(52) U.S. Cl.
CPC .......... *H05B 33/0845* (2013.01); *H03M 1/12* (2013.01); *H05B 37/02* (2013.01); *H05B 37/0254* (2013.01)

(58) Field of Classification Search
CPC ................ H05B 33/08; H05B 33/0845; H05B 33/0857; H05B 37/02; H05B 37/0227; H05B 37/0272; H03M 1/12

USPC .... 315/151, 152, 209 R, 291, 307, 308, 312
See application file for complete search history.

(56) References Cited

U.S. PATENT DOCUMENTS

| 8,072,164 B2 | 12/2011 | Ilyes et al. | |
| 9,030,122 B2 * | 5/2015 | Yan ..................... | H05B 33/0818 315/291 |
| 2005/0179404 A1 * | 8/2005 | Veskovic ........... | H05B 37/0254 315/291 |
| 2008/0018261 A1 * | 1/2008 | Kastner ................... | F21V 23/00 315/192 |

\* cited by examiner

*Primary Examiner* — Jimmy Vu
(74) *Attorney, Agent, or Firm* — Peter Dimauro

(57) ABSTRACT

Aspects of the present disclosure include a dimming device comprising a dimming signal interface module which includes an optical coupling module and an analog-digital converter module having its input terminal connected to the input terminal of the dimming signal interface module and its output terminal selectively connected to the optical coupling module. The dimming signal interface module may receive digital signals and analog signals. When the analog signals are received by the input terminal of the dimming signal interface module, the analog-digital converter module may convert the analog signals to square-wave signals and output the square-wave signals to the optical coupling module. When digital signals are received by the input terminal of the dimming signal interface module, the output terminal of the analog-digital converter module may be disconnected from the optical coupling module. The dimming device may be able to receive digital and analog control signals to be used for dimming.

14 Claims, 2 Drawing Sheets

DIMMING DEVICE AND LIGHTING DEVICE

TECHNICAL FIELD

The present invention relates generally to a lighting device, and more particularly to a multi-functional smart dimming device and a lighting device comprising the dimming device.

BACKGROUND

Energy saving and environmental protection has become a new topic being faced by and studied by the world, which has triggered the global lighting revolution and LED lighting. In 2010, one after another, countries from Europe and North America introduced provisions to gradually phase out incandescent lamps. China will ban the use of incandescent lamps in 2010, and LED will become the primary source of lighting. By using LED light sources to replace traditional light sources, a first energy saving can be achieved; with the introduction of smart lighting, a second energy saving as well as the transformation in lighting management by using LED can be realized on top of the first energy saving.

The core concepts of smart lighting include perception, interconnection, physical integration and intelligence. To reflect the advantages of smart lighting, there must be a lighting terminal that is responsive, feature-rich, safe, and reliable. A lighting terminal in an LED smart lighting system consists of the LED light source, LED driver and dimming controller. The dimming controller controls the LED driver by outputting PWM signals or 0-10 V analog signals. The LED driver outputs current at different levels to the LED light source based on the dimming signal, thereby causing the LED to generate lights at different brightness.

The DALI (Digital Addressable Lighting Interface) protocol is an internationally used open standard in the lighting field. Advantages of the DALI protocol include high energy efficiency, a flexible structure, easy maintenance, and powerful functions, while the dimming system based on the DALI protocol also has very good scalability. Therefore, the DALI protocol is very popular in Europe and the United States, and more and more manufacturers begin to manufacture a variety of lighting devices that are compatible with the DALI protocol.

However, dimming device interfaces from prior art are typically designed to receive only DALI signals or 0-10 V analog signals, and cannot be compatible with both control signals at the same time. This has raised the cost of dimming controllers and caused inconvenience to users.

The prior art also includes a dimming device which can receive both DALI control signals and 0-10 V analog control signals; however, these two different kinds of control signal are received by the dimming device through different signal input terminals. Although this has allowed the dimming device to realize more functionalities, but the requirement to use multiple signal input terminal to input dimming signals still leads to a higher cost of components.

Therefore, it is necessary to provide a solution to solve at least one of the problems described above.

SUMMARY OF THE INVENTION

In order to solve the problems described above, the present invention provides a dimming device comprising: a dimming signal interface module which includes an optical coupling module; and an analog-digital converter module with its input terminal connected to the input terminal of the dimming signal interface module and its output terminal selectively connected to the optical coupling module; wherein the dimming signal interface module is configured to be capable of receiving digital signals and analog signals, and the analog-digital converter module is configured to, when the analog signals are received by the input terminal of the dimming signal interface module, convert the analog signals into square-wave signals which are output to the optical coupling module, and when digital signals are received by the input terminal of the dimming signal interface module, to disconnect the output terminal of the analog-digital converter module from the optical coupling module.

Optionally, the digital signals comprise DALI signals, and the analog signals comprise analog voltage signals or analog resistance signals.

Optionally, the square-wave signals comprise PWM signals or frequency signals corresponding to the analog signals which are preset.

Optionally, the dimming device further comprises a mirror current source connected to the input terminal of the dimming interface module, and the analog resistance signals pass through the mirror current source to generate the analog voltage signals when the analog resistance signals are received by the dimming interface module.

Optionally, the analog voltage signals are 0-10 V DC voltage signals.

Optionally, the analog-digital converter module comprises a voltage-frequency converter module used for converting the analog voltage signals into the frequency signals.

Optionally, the analog-digital converter module comprises a voltage-duty cycle converter module used for converting the analog voltage signals into the PWM signals.

Optionally, the dimming device further comprises a control module configured to, when the digital signals are received by the input terminal of the dimming interface module, control the analog-digital converter module to be disconnected from the dimming device, and to, when the analog signals are received by the input terminal of the dimming interface module, control the analog-digital converter module to be connected to the dimming device.

Optionally, the dimming device further comprises an identification module which include a Zener diode D1, a first transistor M1 and a second transistor M2; wherein the cathode of the Zener diode is connected to the input terminal, the anode of the Zener diode is connected to the gate of the first transistor, the drain of the first transistor is connected to the control terminal of the analog-digital converter module and the output terminal of the analog-digital converter is connected to the optical coupling module via the second transistor.

Optionally, when the digital signals are received by the input terminal of the dimming interface module, the Zener diode D1 is broken down, the first transistor M1 is turned on and the second transistor M2 is turned off, the analog-digital converter module is disconnected from the optical coupling device.

Optionally, when the analog signals are received by the input terminal of the dimming interface module, the Zener diode D1 is not broken down, the first transistor M1 is turned off and the second transistor M2 is turned on, and the analog-digital converter module is connected to the optical coupling device.

Another aspect of the present invention is to provide a dimming device which comprises: a dimming signal interface module which comprises a first optical coupling device; an analog-digital converter module having its input terminal selectively connected to input terminal of the dimming signal interface module; and a second optical coupling module having its input terminal connected to the output terminal of the analog-digital converter module; wherein the dimming signal interface module is configured to be capable of receiving digital signals and analog signals, and the analog-digital converter module is configured, when the analog signals are received by the input terminal of the dimming signal interface module, convert the analog signals into square-ware signals which are output to the second optical coupling module, and, when digital signals are received by the input terminal of the dimming signal interface module, to disconnect the output terminal of the analog-digital converter from the dimming interface module.

Optionally, the dimming device further comprises a control module configured to, when the digital signals are received by the input terminal of the dimming interface module, control the input terminal of the analog-digital converter module to be disconnected from the dimming interface module, and, when the analog signals are received by the input terminal of the dimming interface module, to control the output terminal of the analog-digital converter module to be connected to the dimming interface module.

Another aspect of the present invention is to provide a lighting device which comprises any of the dimming devices described above.

As can be seen from the above summary of the technical solution of the present invention, when the dimming device receives the DALI signals, it does not need to go through the analog-digital converter module to act on the dimming device; when the dimming device receives the analog signals, the signals are converted into square-wave signals by the analog signal conversion which are then used to drive the dimming device. This allows the dimming device of the present invention to use the unified signal input terminal to receive different dimming control signals, thereby saving manufacturing costs, and providing convenience to the users.

Other features and aspects will become apparent in conjunction with the detailed description, the drawings, and the claims that follow.

BRIEF DESCRIPTION OF THE DRAWINGS

These and other features, aspects, and advantages of the present invention will become better understood when the following detailed description is read by referring to the accompanying drawings in which same reference numerals are used throughout the drawings to refer to same parts, wherein.

BRIEF SUMMARY

The specific embodiments of the present invention will be described in detail below with reference to the accompanying drawings in order to facilitate those skilled in the art to fully understand the subject matter claimed by the present invention. In the following detailed description of these specific embodiments, the present specification does not describe in detail any of the known functions or configurations, to avoid unnecessary details that may affect the disclosure of the present invention.

Unless otherwise defined, the technical and scientific terms used in the claims and the specification are as they are usually understood by those skilled in the art to which the present invention pertains. "First", "second" and similar words used in this specification and in the claims do not denote any order, quantity or importance, but are merely intended to distinguish between different constituents. The terms "one", "a" and the like are not meant to be limiting, but rather denote the presence of at least one. "Comprising", "including" and similar words mean that elements or articles appearing before "comprising" or "including" include the elements or articles and their equivalent elements appearing behind "comprising" or "including", not excluding any other elements or articles. "Connected", "coupled" and similar words are not restricted to physical or mechanical connections, but may include electrical connections, whether direct or indirect.

Figure 1:
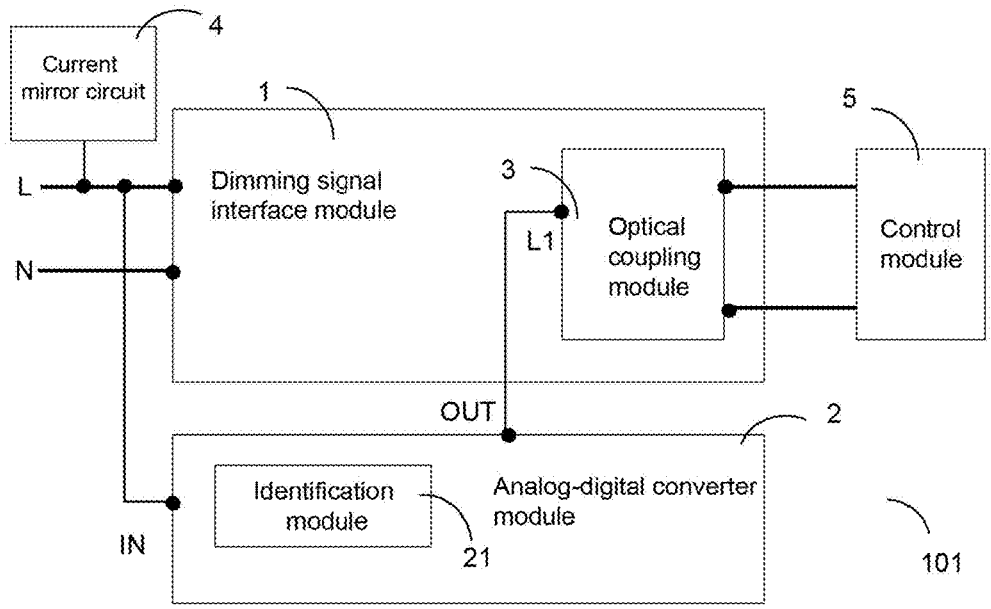
FIG. 1 is a block diagram of the overall configuration of the first embodiment in accordance with the present invention.

FIG. 1 shows a block diagram of the overall configuration of the first embodiment in accordance with the present invention. Referring to FIG. 1, the dimming device 101 comprises a dimming signal interface module 1 which comprises an optical coupling module 3; an analog-digital converter module 2 having its input terminal IN connected to input terminal L of the dimming of the dimming signal interface module 1 and its output terminal OUT selectively connected to the input terminal L1 of the optical coupling module 2; wherein the dimming signal interface module 1 is configured to be capable of receiving digital signals and analog signals, and the analog-digital converter module 2 is configured to, when the analog signals are received by the input terminal (L, N) of the dimming signal interface module 1, convert the analog signals into square-wave signals which are output to the optical coupling module 3, and when digital signals are received by the input terminal (L, N) of the dimming signal interface module 1, the analog-digital converter module 2 is disconnected from the optical coupling module 3.

DETAILED DESCRIPTION

In the present invention, the digital signals comprise DALI signals, and the analog signals comprise analog voltage signals or analog resistance signals. The square-wave signals comprise PWM signals or frequency signals corresponding to the analog signals which are preset. The analog voltage signals are 0-10 V DC voltage signals.

The dimming device 101 may further comprise a mirror current source 4 connected to the input terminal L of the dimming interface module 1, and the analog resistance signals pass through the mirror current source to generate the analog voltage signals when the analog resistance signals are received by the dimming interface module 1.

The analog-digital converter module 2 comprises the voltage-frequency converter module; the voltage-frequency converter module 2 is used to convert the analog voltage signals into the frequency signals. Optionally, the analog-digital converter module 2 may further comprise a voltage-duty cycle converter module; the voltage-duty cycle converter module is used to convert the analog voltage signals into the duty-cycle signals, and according to common sense, the duty-cycle signals belong to the PWM signals. When the optical coupling module 3 receives a high level of the frequency signals or the duty-cycle signals, it turns on, and vice versa.

Referring to FIG. 1 again, the dimming device 101 may further comprise a control module 5; the control module 5 comprises a single-chip circuit (not shown). The control module 5 is configured to, when the digital signals are received by the input terminal (L, N) of the dimming interface module 1, the control module 5 is able to identify the digital signals and control the analog-digital converter module 2 to be disconnected from the optical coupling module 3; and when analog signals are received by the input terminal (L, N) of the dimming interface module 1, the control module 5 connects the analog-digital converter module 2 to the optical coupling module 3.

Figure 2:
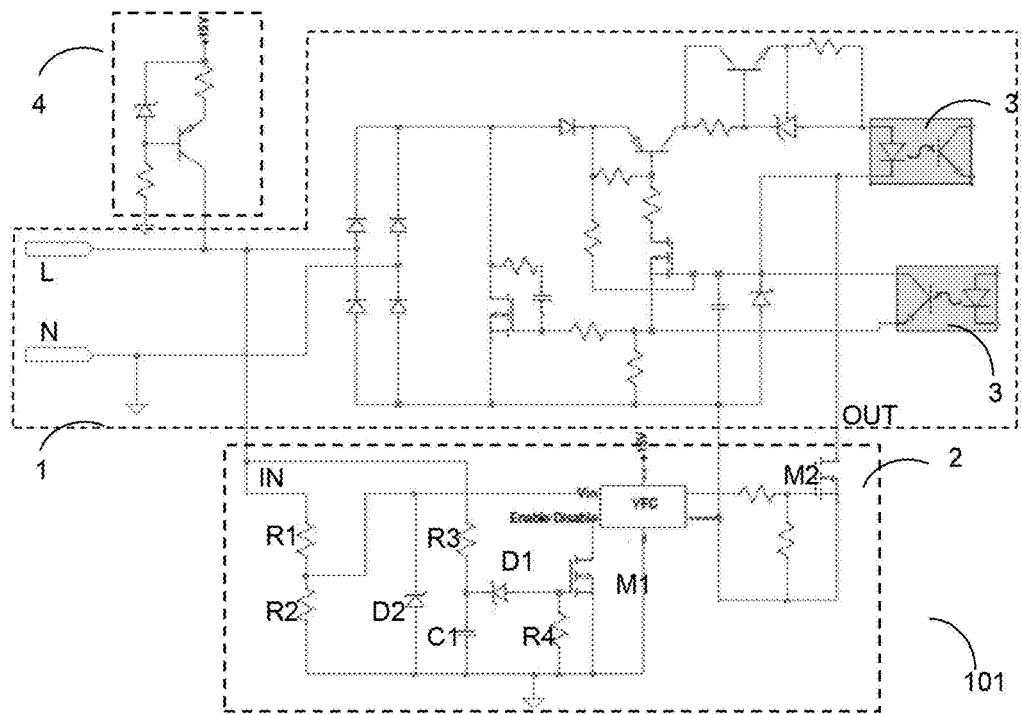
FIG. 2 is the schematic view of a specific example of the first embodiment of the dimming device in accordance with the present invention.

FIG. 2 is the schematic view of a specific example of the first embodiment of the dimming device in accordance with the present invention. As shown in FIG. 2, the dimming device 101 further comprises an identification module 21 which comprises a Zener diode D1, a first transistor M1 and a second transistor M2; wherein, the cathode of the Zener diode D1 is connected to the input terminal L, the anode is connected to the gate of the first transistor M1; the drain of the first transistor M1 is connected to the control terminal Enable/Disable of the analog-digital converter module 2, the source of the first transistor M1 is grounded, and the output terminal OUT of the analog-digital converter module 2 is connected to the optical coupling module 5 via the second transistor M2.

In particular, the identification module 21 may further comprise a voltage divider and filter circuit, which comprises resistors R1, R2, R3, R4, diode D2 and capacitor C1. One end of the resistor R1 is connected to the input terminal IN of the analog-digital converter module 1, the other end is connected to resistor R2, the cathode of the diode D2 is connected to the neutral-point of resistors R1 and R2, the other end of resistor R2 is connected to the anode of the diode D2 and is grounded. The circuit is used to receive the analog voltage signal received by the input terminal IN and to implement the voltage dividing function. One end of resistor R3 is connected to the input terminal IN of the analog-digital converter module 1, the other end is connected to the cathode of the Zener diode D1 and one end of the capacitor C1, the other end of the capacitor C1 is connected to one end of the resistor R4 and the anode of the diode D8 and is grounded. The anode of the Zener diode D1 is connected to the other end of resistor R4 and the gate of the first transistor M1.

Refer to FIG. 2 again, when the digital signals are received by the input terminal L of the dimming interface module 2, such as DALI signals, the Zener diode D1 is broken down, the first transistor M1 is turned on, the second transistor M2 is turned off, and the analog-digital converter module 2 is disconnected from the dimming device 101. In this case, DALI signals go through the dimming interface module 2 and are directly transmitted to the optical coupling module 3. The optical coupling module 3 is able to identify the DALI signals, and to control ON or OFF according to the DALI signal.

In addition, when the analog signals are received by the input terminal L of the dimming interface module 1, the Zener diode D1 is not broken down, the first transistor M1 is turned off, the second transistor M2 is turned on, and the analog-digital converter module 2 is connected to the dimming device 101. In this case, analog signals pass through the analog-digital converter module 2 and is converted by the analog-digital converter module into frequency signals or the PWM signals and transmitted to the optical coupling module 3. The optical coupling module 3 is able to identify the frequency signals or the PWM signals, and controls ON/OFF according to the frequency signals or duty-cycle signals described above.

Figure 3:
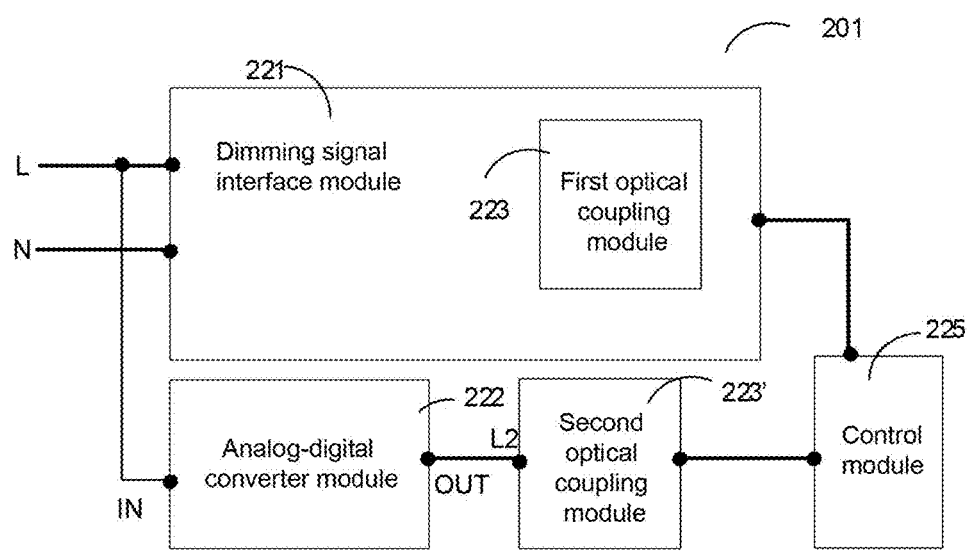
FIG. 3 is a block diagram showing the overall configuration of the second embodiment in accordance with the present invention.

FIG. 3 is a block diagram showing the overall configuration of the second embodiment in accordance with the present invention. As shown in FIG. 3, the dimming device 201 comprises a dimming signal interface module 221 which comprises a first optical coupling module 223; an analog-digital converter module 222 with its input terminal IN selectively connected to the input terminal of the dimming signal interface module 221; and a second optical coupling module 223' with its input terminal L2 connected to the output terminal OUT of the analog-digital converter module 222; wherein, the dimming signal interface module 221 is configured to be able to receive digital signals and analog signals; the analog-digital converter module 222 is configured to, when the analog signals are received by the input terminal (L, N) of the dimming signal interface module 221, convert the analog signals into square-wave signals which are output to the second optical coupling module 223', and when digital signals are received by the input terminal (L, N) of the dimming signal interface module 221, the input terminal IN of the analog-digital converter module is disconnected from the dimming interface module 221.

Refer to FIG. 3 again, the dimming device 201 further comprises a control module 225, the control module 225 is configured to, when the digital signals are received by the input terminal (L, N) of the dimming interface module 221, the control module 225 controls the input terminal IN analog-digital converter module 222 to be disconnected from the dimming interface module 221; and when analog signals are received by the input terminal (L, N) of the dimming interface module 221, the control module 225 connects the input terminal IN of the analog-digital converter module 222 to the dimming interface module 221. In particular, the control module controls the connection or disconnection between the input terminal of the two modules above by turning on and off the switch located in between the input terminal L of the dimming interface module and the input terminal IN of the analog-digital converter module. When digital signals are received by the input terminal L of the dimming interface module, such as DALI signals, the control module turns on or off the switch, thereby allowing the analog-digital converter module to be disconnected from the dimming interface module; when analog signals are received by the input terminal (L, N) of the dimming interface module, the control module turns on the switch, thereby allowing the analog-digital converter module to be connected to the dimming interface module.

Embodiments of the present invention may also provide a lighting device comprising the dimming device 101 or 201 described above.

The dimming device of the present invention, having the above-described analog-digital converter module, therefore can use the same signal input terminal to receive digital signals or analog signals for dimming. When DALI signals are received by the dimming device, they do not need to pass through the analog-digital converter module to act on the dimming device; when analog signals are received by the dimming device, the signals are converted into square-wave signals through analog signal conversion, and the square-wave signals are used to drive the dimming device. This allows the dimming device of the present invention to have a unified and multi-functional dimming signal interface, thereby saving the manufacturing cost of the dimming device, and realizing multiple functionalities for users.

The lighting device of the present invention, having the above-mentioned dimming device, allows the lighting device of the present invention to have a unified and multi-functional dimming signal interface, thereby saving the manufacturing cost of the dimming device, and realizing multiple functionalities for users.

While the present invention has been described in detail with reference to specific embodiments thereof, it will be understood by those skilled in the art that many modifications and variations can be made in the present invention. It will be appreciated that the appended claims are intended to cover all such modifications and variations insofar as they are within the true spirit and scope of the invention.

The invention claimed is:

1. A dimming device, comprising:
   a dimming signal interface module which includes an optical coupling module; and
   an analog-digital converter module having an input terminal and an output terminal, and the input terminal of the analog-digital module is connected to an input terminal of the dimming signal interface module and the output terminal of the analog-digital converter is selectively connected to the optical coupling module;
   wherein, the dimming signal interface module is configured to be capable of receiving digital signals and analog signals, and
   the analog-digital converter module is configured to, when the analog signals are received by the input terminal of the dimming signal interface module, convert the analog signals to square-wave signals and the square-wave signals are output to the optical coupling module, and
   when digital signals are received by the input terminal of the dimming signal interface module, the output terminal of the analog-digital converter module are disconnected from the optical coupling module.

2. The dimming device, according to claim 1, is characterized in that the digital signals comprise DALI signals, and the analog signals comprise analog voltage signals or analog resistance signals.

3. The dimming device, according to claim 2, is characterized in that the square-wave signals comprise PWM signals or frequency signals corresponding to the analog signals which are preset.

4. The dimming device, according to claim 2, is characterized in that the dimming device further comprises a mirror current source connected to the input terminal of the dimming interface module, and the analog resistance signals pass through the mirror current source to generate the analog voltage signals when the analog resistance signals are received by the dimming interface module.

5. The dimming device, according to claim 2, is characterized in that the analog voltage signals are 1-10V DC voltage signals.

6. The dimming device according to claim 4, is characterized in that the analog-digital converter module comprises a voltage-frequency converter module for converting the analog voltage signals into the frequency signals.

7. The dimming device, according to claim 4, is characterized in that the analog-digital converter module comprises a voltage-duty cycle converter module for converting the analog voltage signals into the PWM signals.

8. The dimming device, according to claim 1, is characterized in that the dimming device further comprises a control module configured to, when the digital signals are received by the input terminal of the dimming interface module, control the output terminal of the analog-digital converter module to be disconnected from the optical coupling module, and to, when the analog signals are received by the input terminal of the dimming interface module, control the output terminal of the analog-digital converter module to be connected to the optical coupling module.

9. The dimming device, according to claim 1, is characterized in that the dimming device further comprises an identification module which comprises a Zener diode, a first transistor, and a second transistor, wherein the cathode of the Zener diode is connected to the input terminal of the dimming signal interface module, the anode of the Zener diode is connected to the gate of the first transistor, the drain of the first transistor is connected to the control terminal of the analog-digital converter, the source of the first transistor is grounded, and the output terminal of the analog-digital converter is connected to the optical coupling module via the second transistor.

10. The dimming device, according to claim 9, is characterized in that when the digital signals are received by the input terminal of the dimming interface module, the Zener diode is broken down, the first transistor is turned on, the second transistor is turned off, and the output terminal of the analog-digital converter module is disconnected from the optical coupling device.

11. The dimming device, according to claim 9, is characterized in that when the analog signals are received by the input terminal of the dimming interface module, the Zener diode is not broken down, the first transistor is turned off, the second transistor is turned on, and the output terminal of the analog-digital converter module is connected to the optical coupling device.

12. A lighting device, comprising:
   a dimming signal interface module which include a first optical coupling device;
   an analog-digital converter module having an input terminal and an output terminal, and the input terminal of the analog-digital converter module is selectively connected to an input terminal of the dimming signal interface module; and
   a second optical coupling module having an input terminal of the second optical coupling module connected to the output terminal of the analog-digital converter module;
   wherein, the dimming signal interface module is configured to be capable of receiving digital signals and analog signals, and
   the analog-digital converter module is configured to, when the analog signals are received by the input terminal of the dimming signal interface module, convert the analog signals into square-wave signals which are output to the second optical coupling module, and, when digital signals are received by the input terminal of the dimming signal interface module, to disconnect the output terminal of the analog-digital converter from the dimming interface module.

13. The dimming device, according to claim 12, is characterized in that the dimming device further comprises a control module configured to, when the digital signals are received by the input terminal of the dimming interface module, control the output terminal of the analog-digital converter module to be disconnected from the dimming interface module, and, when the analog signals are received by the input terminal of the dimming interface module, to control the output terminal of the analog-digital converter module to be connected to the dimming interface module.

14. A lighting device which include the dimming devices described in claim 13.